(12) United States Patent
Fujii

(10) Patent No.: US 6,876,869 B1
(45) Date of Patent: Apr. 5, 2005

(54) CODING ASSISTING EQUIPMENT, DECODING ASSISTING EQUIPMENT, RADIO TRANSMITTER, AND RADIO RECEIVER

(75) Inventor: Masatsugu Fujii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,786

(22) Filed: Mar. 29, 2000

(30) Foreign Application Priority Data

Jul. 29, 1999 (JP) .......................................... 11-215290

(51) Int. Cl.[7] .............................................. H04B 1/38
(52) U.S. Cl. ...................... 455/550.1; 455/561; 455/95; 375/246; 341/173
(58) Field of Search .......................... 455/550.1, 575.1, 455/561, 268, 456.5, 456.6, 425, 407, 408, 556.1, 556.2, 95, 277.1, 550, 575; 375/246, 265, 110, 114, 116, 377, 295, 240.24, 240.27; 341/106, 173, 59, 76, 50, 68–72; 714/746, 759

(56) References Cited

U.S. PATENT DOCUMENTS

| | | | | |
|---|---|---|---|---|
| 4,670,890 A | * | 6/1987 | Titchener .................... | 375/110 |
| 5,162,908 A | * | 11/1992 | Kim .......................... | 358/133 |
| 5,327,441 A | * | 7/1994 | Kawazoe et al. ............. | 371/43 |
| 5,349,350 A | * | 9/1994 | Blagaila ..................... | 341/59 |
| 5,612,974 A | * | 3/1997 | Astrachan ................... | 375/295 |
| 5,710,784 A | * | 1/1998 | Kindred et al. .............. | 371/43 |
| 5,787,099 A | * | 7/1998 | Lan et al. ................... | 371/37.07 |
| 5,832,031 A | * | 11/1998 | Hammons, Jr. ............. | 375/262 |
| 5,969,975 A | * | 10/1999 | Glass et al. ................ | 364/736.01 |
| 6,275,538 B1 | * | 8/2001 | Ramesh et al. ............. | 375/265 |
| 6,483,944 B1 | * | 11/2002 | Sugahara et al. ........... | 382/232 |

FOREIGN PATENT DOCUMENTS

| | | |
|---|---|---|
| JP | 07131400 | 5/1995 |
| JP | 08330978 | 12/1996 |
| JP | 09046240 | 2/1997 |
| JP | 10022937 | 1/1998 |

* cited by examiner

*Primary Examiner*—Edward F. Urban
*Assistant Examiner*—Charles Chow
(74) *Attorney, Agent, or Firm*—Katten Muchin Zavis Rosenman

(57) ABSTRACT

A coding assisting equipment is provided in which transmission information is fed in such a manner as to be divided into words having a predetermined word length and is coded collectively through a computing unit that is formed as a combinational circuit. A decoding assisting equipment is provided in which a received sequence is fed in such a manner as to be divided into words having a predetermined word length and is decoded collectively through a computing unit that is formed as a combinational circuit. A radio transmitter and a radio receiver are provided that incorporates the above coding assisting equipment and the decoding assisting equipment, respectively. In a transmission system to which the invention is applied, the service quality and the transmission efficiency are increased in an inexpensive manner, resources are utilized effectively, and flexible application of a variety of systems is enabled.

16 Claims, 11 Drawing Sheets

F I G. 4
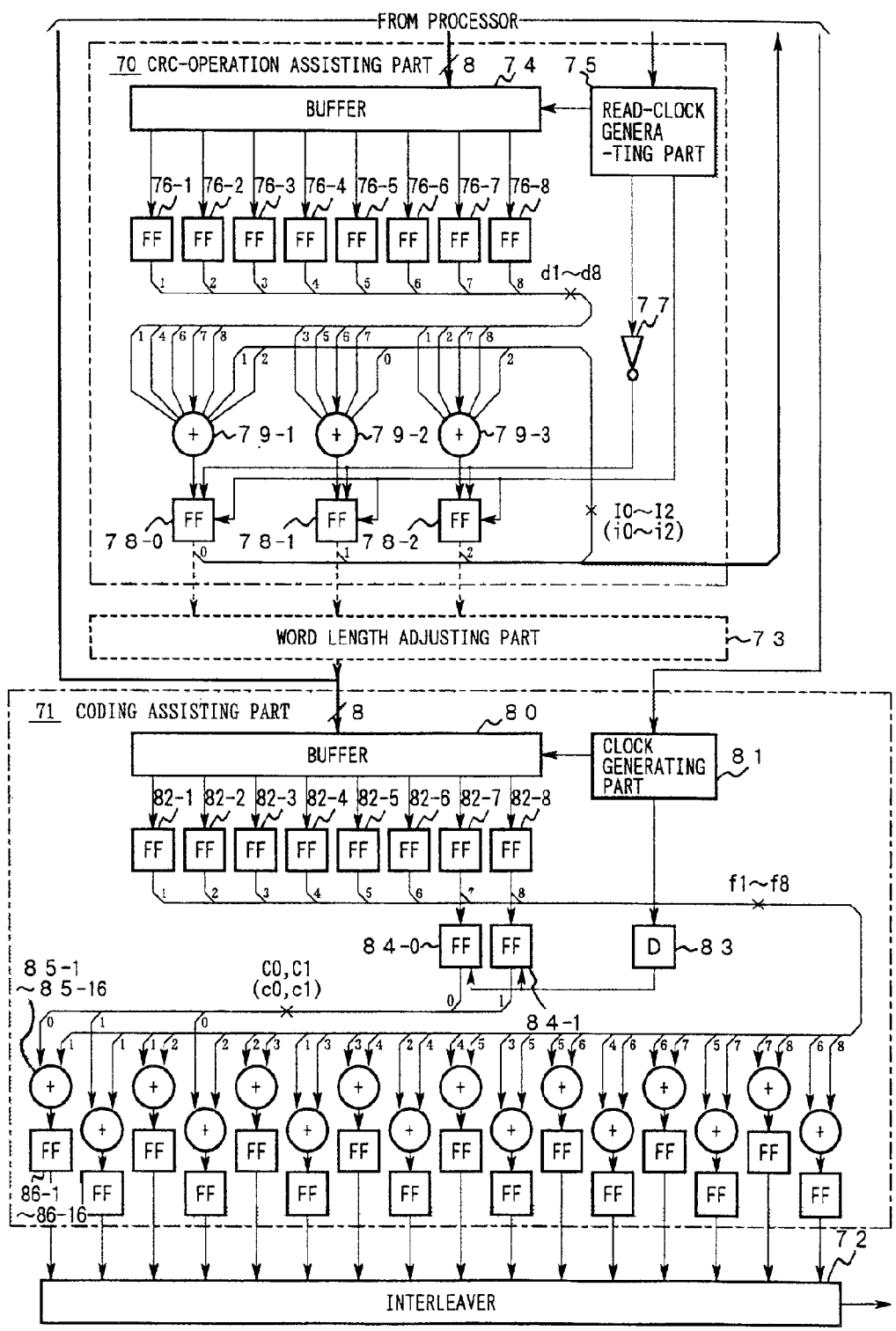

FIG. 5

| | LOGICAL VALUE OBTAINED AT THE OUTPUT OF THE EXCLUSIVE-OR GATE 129 | LOGICAL VALUE HELD BY THE FLIP-FLOP 130-1 | LOGICAL VALUE HELD BY THE FLIP-FLOP 130-2 | LOGICAL VALUE OBTAINED AT THE OUTPUT OF THE EXCLUSIVE-OR GATE 131 | LOGICAL VALUE HELD BY THE FLIP-FLOP 130-3 |
|---|---|---|---|---|---|
| — | — | i0 | i1 | — | i2 |
| d1 | i2⊕d1 | i2⊕d1 | i0 | i2⊕d1⊕i1 | i1⊕i2⊕d1 |
| d2 | i1⊕i2⊕d1⊕d2 | i1⊕i2⊕d1⊕d2 | i2⊕d1 | i1⊕i2⊕d1⊕d2⊕i0 | i0⊕i1⊕i2⊕d1⊕d2 |
| d3 | i0⊕i1⊕i2⊕d1⊕d2⊕d3 | i0⊕i1⊕i2⊕d1⊕d2⊕d3 | i1⊕i2⊕d1⊕d2 | i0⊕i1⊕i2⊕d1⊕d2⊕d3⊕i2⊕d1 | i0⊕i1⊕d2⊕d3 |
| d4 | i0⊕i1⊕d2⊕d3⊕d4 | i0⊕i1⊕d2⊕d3⊕d4 | i0⊕i1⊕i2⊕d1⊕d2⊕d3 | i0⊕i1⊕d2⊕d3⊕d4⊕i1⊕i2⊕d1⊕d2 | i0⊕i2⊕d1⊕d3⊕d4 |
| d5 | i0⊕i2⊕d1⊕d3⊕d4⊕d5 | i0⊕i2⊕d1⊕d3⊕d4⊕d5 | i0⊕i1⊕d2⊕d3⊕d4 | i0⊕i2⊕d1⊕d3⊕d4⊕d5⊕i0⊕i1⊕i2 ⊕d1⊕d2⊕d3 | i1⊕d2⊕d4⊕d5 |
| d6 | i1⊕d2⊕d4⊕d5⊕d6 | i1⊕d2⊕d4⊕d5⊕d6 | i0⊕i2⊕d1⊕d3⊕d4⊕d5 | i1⊕d2⊕d4⊕d5⊕d6⊕i0⊕i1⊕d2⊕d3⊕d4 | i0⊕d3⊕d5⊕d6 |
| d7 | i0⊕d3⊕d5⊕d6⊕d7 | i0⊕d3⊕d5⊕d6⊕d7 | i1⊕d2⊕d4⊕d5⊕d6 | i0⊕d3⊕d5⊕d6⊕d7⊕i0⊕i2⊕d1⊕d3⊕d4 ⊕d5 | i2⊕d1⊕d4⊕d6⊕d7 |
| d8 | i2⊕d1⊕d4⊕d6⊕d7⊕d8 | I0= i2⊕d1⊕d4⊕d6⊕d7⊕d8 | I1= i0⊕d3⊕d5⊕d6⊕d7 | i2⊕d1⊕d4⊕d6⊕d7⊕d8 ⊕i1⊕d2⊕d4⊕d5⊕d6 | I2= i1⊕i2⊕d1⊕d2⊕d5⊕d7⊕d8 |

FIG. 6

| LOGICAL VALUE HELD BY THE FLIP-FLOP 131-1 | LOGICAL VALUE HELD BY THE FLIP-FLOP 131-2 | LOGICAL VALUE HELD BY THE FLIP-FLOP 131-3 | LOGICAL VALUE OBTAINED AT THE OUTPUT OF THE EXCLUSIVE-OR GATE 132-1 | LOGICAL VALUE OBTAINED AT THE OUTPUT OF THE EXCLUSIVE-OR GATE 132-2 |
|---|---|---|---|---|
| $c_0$ | $c_1$ | $c_2$ | — | — |
| $f_1$ | $c_0$ | $c_1$ | $g_1 = c_0 \oplus f_1$ | — |
| $f_2$ | $f_1$ | $c_0$ | — | $g_2 = c_1 \oplus f_1$ |
| $f_3$ | $f_2$ | $f_1$ | $g_3 = f_1 \oplus f_2$ | — |
| $f_4$ | $f_3$ | $f_2$ | — | $g_4 = c_0 \oplus f_2$ |
| $f_5$ | $f_4$ | $f_3$ | $g_5 = f_2 \oplus f_3$ | — |
| $f_6$ | $f_5$ | $f_4$ | — | $g_6 = f_1 \oplus f_3$ |
| $f_7$ | $f_6$ | $f_5$ | $g_7 = f_3 \oplus f_4$ | — |
| $f_8$ | $f_7$ | $f_6$ | — | $g_8 = f_2 \oplus f_4$ |
|  |  |  | $g_9 = f_4 \oplus f_5$ | — |
|  |  |  | — | $g_{10} = f_3 \oplus f_5$ |
|  |  |  | $g_{11} = f_5 \oplus f_6$ | — |
|  |  |  | — | $g_{12} = f_4 \oplus f_6$ |
|  |  |  | $g_{13} = f_6 \oplus f_7$ | — |
|  |  |  | — | $g_{14} = f_5 \oplus f_7$ |
|  |  |  | $g_{15} = f_7 \oplus f_8$ | — |
|  |  |  | — | $g_{16} = f_6 \oplus f_8$ |

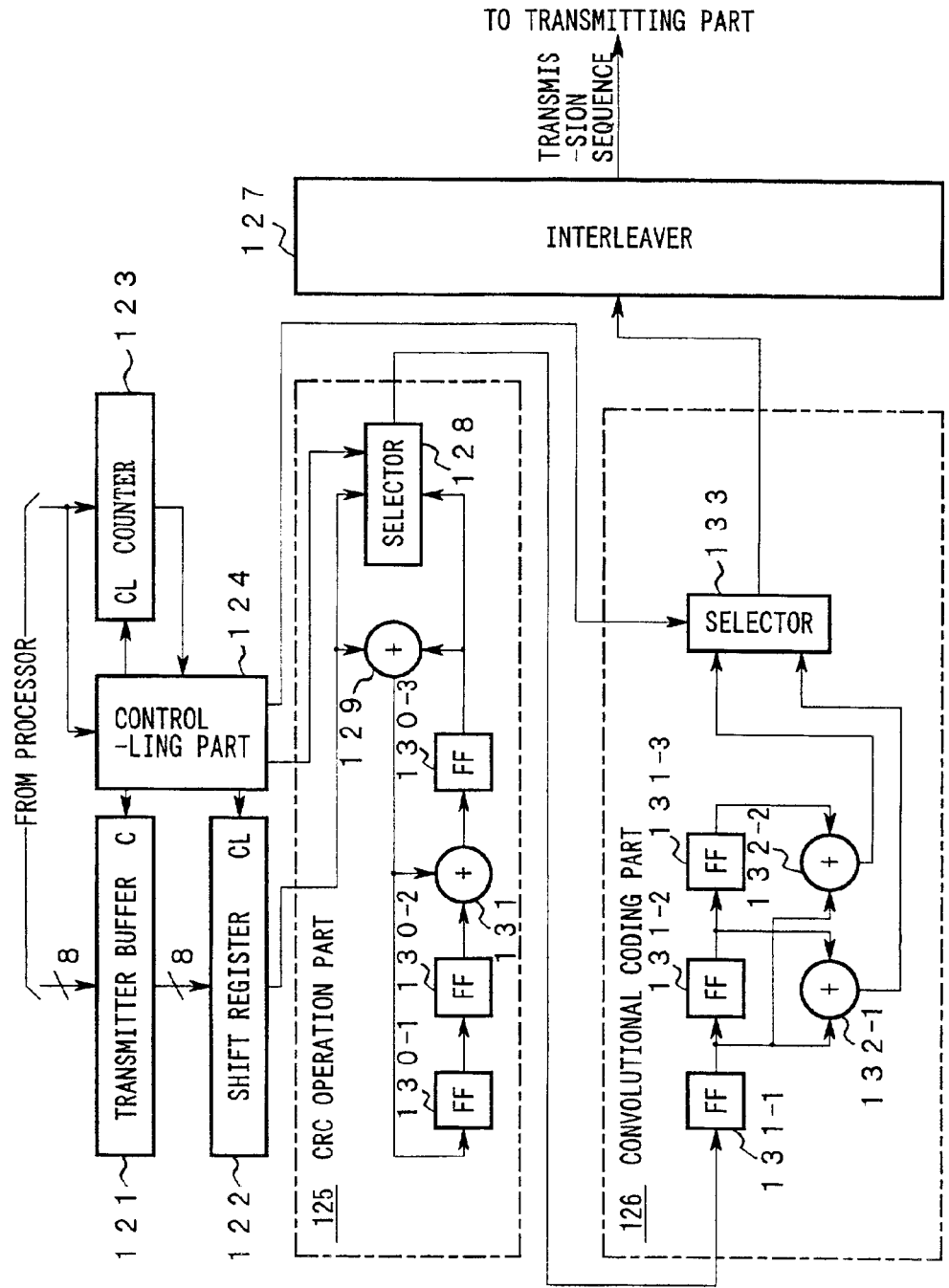

PRIOR ART FIG. 11
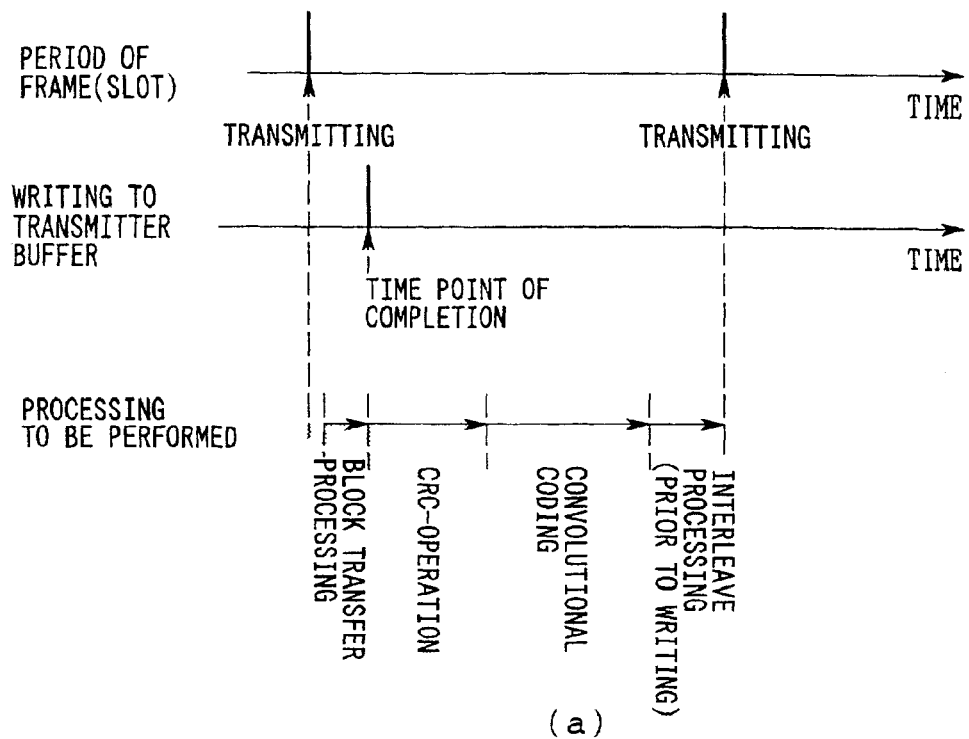
(a)
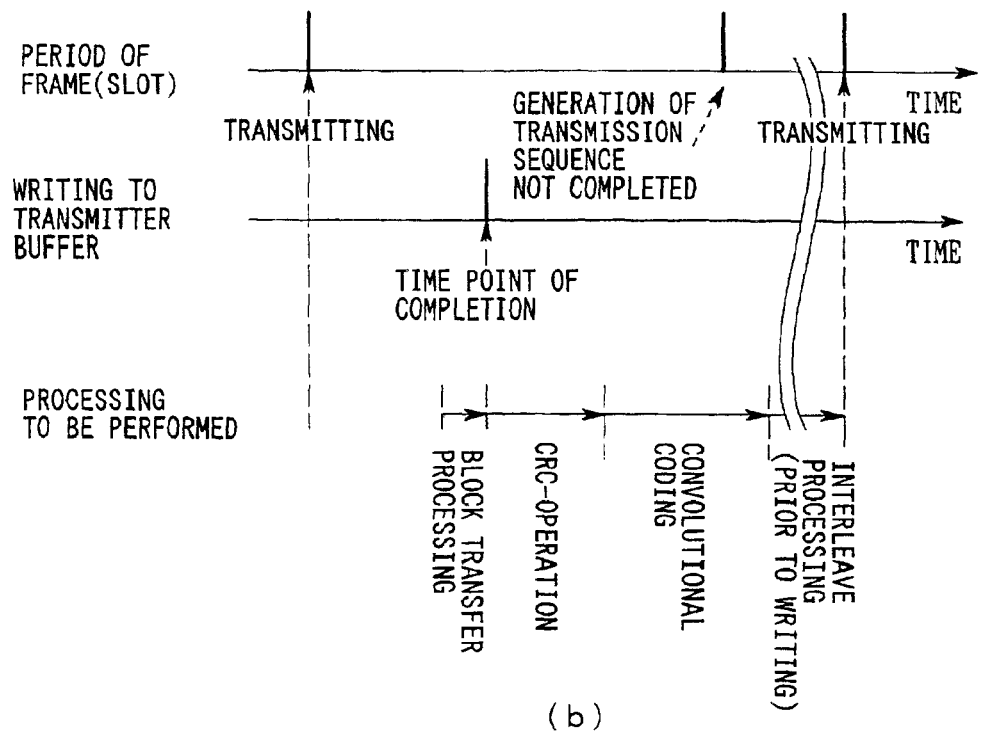
(b)

CODING ASSISTING EQUIPMENT, DECODING ASSISTING EQUIPMENT, RADIO TRANSMITTER, AND RADIO RECEIVER

BACKGROUND OF THE INVENTION

1. Field of the Invention

The present invention relates to a coding assisting equipment and a decoding assisting equipment that are fed with information that is split into pieces having a predetermined word length and assist coding and decoding, respectively, of the information, as well as to the coding assisting equipment and the decoding assisting apparatus having such a coding assisting equipment or decoding assisting equipment.

2. Description of the Related Art

In recent years, a variety of digital modulation systems have been applied to mobile communication systems and other radio transmission systems to effectively utilize radio frequencies and realize high transmission rates.

At transmitting ends and receiving ends of such mobile communication systems, to secure desired transmission quality even in a state that the transmission characteristics of a radio transmission channel formed between a mobile station and a radio base station severely degrades, coding/decoding, interleave processing, and other processing that are adapted to such a radio transmission channel are performed.

FIG. 10 shows an example configuration of a coding part that is incorporated in a mobile station equipment.

In FIG. 10, a first output port of a processor (not shown) is connected to the input of a transmitter buffer 121. The output of the transmitter buffer 121 is connected to a parallel load terminal of a shift register 122. A clock terminal CL of the shift register 122, a read control terminal C of the transmitter buffer 121, and the output and a clock input CL of a counter 123 are connected to the corresponding input/output terminals of a controlling part 124. A second output port of the processor is connected to a reset terminal of the counter 123 and an activation input of the controlling part 124. A serial output of the shift register 122 is connected to a corresponding input of a CRC operation part 125, and the output of the CRC operation part 125 is connected to a modulation input of a transmitting part (not shown) via a convolutional coding part 126 and an interleaver 127. Corresponding outputs of the controlling part 124 are connected to respective control inputs of the CRC operation part 125 and the convolutional coding part 126.

The CRC operation part 125 is composed of a selector 128 one input of which is directly connected to the serial output of the shift register 122 and that is disposed as the final stage, an exclusive-OR gate 129 one input of which is directly connected to the serial output of the shift register 122 together with the one input of the selector 128, flip-flops (FFS) 130-1 and 130-2 that are cascaded to the output of the exclusive-OR gate 129, an exclusive-OR gate 131 one input of which is connected to the output of the exclusive-OR gate 129 together with the input of the flip-flop 130-1 and the other input of which is connected to the output of the flip-flop 130-2, and a flip-flop (FF) 130-3 the input of which is connected to the output of the exclusive-OR gate 131 and the output of which is connected to the other inputs of the exclusive-OR gate 129 and the selector 128.

The convolutional coding part 126 is composed of a cascade connection of flip-flops (FFs) 131-1 to 131-3 that is connected to the output of the CRC operation part 125 (selector 128), an exclusive-OR gate 132-1 having two inputs that are directly connected to the outputs of the respective flip-flops 131-1 and 131-2, an exclusive-OR gate 132-2 having two inputs that are directly connected to the outputs of the respective flip-flops 131-1 and 131-3, and a selector 133 that is disposed as the final stage and has two inputs that are connected to the outputs of the respective exclusive-OR gates 132-1 and 132-2.

In the above-configured conventional example, transmission information to be subjected to a CRC operation and convolutional coding (both described later) is stored in the transmitter buffer 121 collectively while being split by the processor into bytes. In the following description, such a series of processing performed by the processor to write transmission information to the transmitter buffer 121 will be referred to simply as "block transfer processing."

When writing of all transmission information to the transmitter buffer 121 has completed, the processor feeds a reset signal to the counter 123 and the controlling part 124.

When receiving the reset signal, the counter 123 resets the count value, performs counting at a predetermined cycle, and sequentially outputs addresses as results of the counting.

When receiving the reset signal, the controlling part 124 supplies the selector 128 with a first selection signal indicating that "partial transmission information" (described later) should be selected, and resets the selector 133.

Every time the address that is output from the counter 123 is updated (including being initialized), the controlling part 124 commands the transmitter buffer 121 to read a byte (hereinafter referred to as "partial transmission information") that is stored in a storage area corresponding to a new address among the storage areas of the transmitter buffer 121. Further, the controlling part 124 requests the shift register 122 to load the partial transmission information, and supplies the shift register 122 with a clock signal whose cycle is equal to ⅛ of the above-mentioned cycle.

The shift register 122 sequentially outputs already loaded partial transmission information bit-by-bit in synchronism with this clock signal.

In the CRC operation part 125, unless the above-mentioned first selection signal is updated, the selector 128 selects partial transmission information that is output serially from the shift register 122.

The exclusive-OR gates 129 and 131 and the flip-flops 130-1 to 130-3 generate an FCS (frame check sequence) to be added to the transmission information by dividing a sequence of the above-described partial transmission information by a generator polynomial G (x), which is given by $$G(x) = x^3 + x^2 + 1.$$

When the address that is output from the counter 123 has reached a predetermined value, the controlling part 124 identifies a point in time when the first bit of an FCS that conforms to the combination of the word length of the transmission information and the above-mentioned generator polynomial G (x) is obtained, updates the above-mentioned first selection signal, and fixes the logical value that is obtained at the output of the shift register 122 at "0."

In the CRC operation part 125, when the first selection signal is updated, the selector 128 selects, instead of the partial transmission information, the FCS that is sequentially obtained in a serial manner via the flip-flop 130-3.

Therefore, a bit string consisting of the transmission information and the FCS that is added to the tail of transmission information end is obtained at the output of the selector 128 in a serial manner.

On the other hand, in the convolutional coding part 126, the selector 133 alternately selects the outputs of the exclusive-OR gates 132-1 and 132-2 at a frequency that is two times the bit rate of the above-mentioned bit string with the point in time of the resetting by the controlling part 124 employed as a reference.

The exclusive-OR gates 132-1 and 132-2 and the flip-flops 131-1 to 131-3 perform convolutional coding (rate of the code: ½; constraint length: 3) on the above-mentioned bit string by cooperating with the selector 133 while sequentially capturing the bit string bit-by-bit and performing predetermined logical operations.

The interleaver 127 sequentially captures and stores convolutional codes generated by the convolutional coding part 126 through the above convolutional coding. Further, the interleaver 127 performs, on the convolutional codes, interleave processing that is effective in reducing the degree of deterioration in transmission quality due to burst errors that may occur in the transmission channel by reading the stored convolutional codes bit-by-bit in predetermined order, and generates a transmission sequence.

That is, the CRC operation, the convolutional coding, and the interleave processing, which should be performed bit-by-bit in a serial manner to generate the transmission sequence, can be performed reliably and efficiently through involvement, only as an information source of transmission information, of a general-purpose processor that is generally not suitable for above kinds of bit-by-bit operations.

Incidentally, in the above conventional example, to start a CRC operation that should be performed prior to transmission of transmission information, the processor should perform the above-mentioned block transfer processing prior to the CRC operation.

Therefore, actually an individual piece of transmission information is not transmitted until after a lapse of time required for the block transfer processing (halftone-dot-meshed in FIGS. 11(A) and 11(B)) in addition to time required for the above-described CRC operation, convolutional coding, and interleave processing from a point in time when it is recognized, based on a channel control procedure etc., that the individual piece of transmission information should be transmitted.

For desired transmission information to be parallel/serial-converted on a partial transmission information basis through cooperation among the controlling part 124, the counter 123, and the shift register 133, it is necessary that the transmitter buffer 121 be of a type having a large hardware scale such as a dual port RAM, a FIFO, or a register file.

The longer the maximum word length of transmission information to be transmitted is, the larger the maximum information content that can be stored in the transmitter buffer 121 is. Therefore, depending on the channel control procedure, the channel allocation, the zone configuration, and other configurations, there is a possibility that the hardware scale of the transmitter buffer 121 accounts for most of that of the coding part of FIG. 10.

In general, the block transfer processing and the processor's processing of transmitting the above-mentioned reset signal are performed asynchronously with frames and slots that should be transmitted to a radio transmission channel. Therefore, if the CRC operation, the convolutional coding, and the interleave processing do not complete by the closest transmission time point that follows a point in time when the block transfer processing is started, the transmission of desired transmission information is deferred to the next transmission time point.

Technically, the parallel/serial conversion of transmission information that is performed in the above-described manner under the cooperation among the transmitter buffer 121, the shift register 122, the counter 123, and the controlling part 124 can be realized as processing performed by the processor. However, in general, the processor is required to perform, on a real-time basis, many kinds of processing that should be completed in predetermined periods, such as a channel control. Therefore, it is necessary that the above-mentioned CRC operation, convolutional coding, and interleave processing be performed by dedicated hardware that is provided to reduce the load of the processor.

Where the response speeds of the shift register 122, the counter 123, the controlling part 124, the CRC operation part 125, the convolutional operation section 126, and the interleaver 127 are sufficiently high, it is possible to increase the efficiency of coding and reduce the hardware size by directly loading, into the shift register 122, skipping the transmitter buffer 121, pieces of partial transmission information that are sequentially fed from the processor.

However, to realize a reliable operation for the maximum speed (e.g., 16 MHz) at which the processor can feed partial transmission information, the CRC operation part 125 needs to respond at a speed (128 MHz) that is eight times faster than the above speed and the convolutional coding part 126 and the interleaver 127 need to respond even two times faster (256 MHz).

Realization of circuits capable of operating at such high speeds is prevented by price-related limitations. Even if such limitations are overcome, limitations relating to the thermal designing and the mounting technology still prevent realization of such circuits because of large increase in power consumption.

This problem could be solved by giving higher priority to the block transfer processing and the processing of outputting a reset signal, of processes performed by the processor, or by making the speed at which partial transmission information is fed lower than a predetermined value.

However, if such a measure is taken, in addition to the task (process) configuration that is the structure of processes to be executed by the processor, methods (synchronization among the tasks, communication, etc.) that realize cooperation among the tasks and the combination of these methods would be refined. Therefore, the timing of processes that do not relate to the above problem may also change.

SUMMARY OF THE INVENTION

An object of the present invention is to provide a coding assisting equipment, a decoding assisting equipment, a radio transmitter, and a radio receiver which can realize desired coding and decoding at high speed with high reliability without the need for changing the basic hardware and software configurations to a large extent.

Another object of the invention is to efficiently realize coding and decoding without the need for providing any means for storing, in advance, all words to be subjected to coding or changing intervals of feeding of those words.

Another object of the invention is to efficiently encode transmission information in parallel operations which are executed word by word.

Another object of the invention is to efficiently decode a received sequence in parallel operations which are executed word by word.

A still another object of the invention is to efficiently tree-code transmission information in parallel operations which are executed word by word.

A further object of the invention is to reliably perform desired coding irrespective of the logical values of invalid bit(s) that is/are packed in transmission information.

Another object of the invention is to reliably perform desired coding as long as words that are fed as transmission information and in which certain invalid bits can be packed and the positions of those invalid bits in the words are known.

Another object of the invention is to decrease a transmission delay of transmission information that is caused by a long coding time of the transmission information, and to increase the transmission efficiency and the efficiency in the use of a radio transmission channel.

Still another object of the invention is to increase the service quality and the transmission efficiency of a transmission system without causing large increase in cost or decrease in reliability, enable effective use of not only a transmission channel but also resources for providing a communication service, and make it possible to flexibly accommodate varieties of multiple access systems, channel mappings, zone configurations, modulation systems, channel control systems, and call setting procedures.

The above objects can be attained by a coding assisting equipment in which coding is performed sequentially, through a computing unit that is formed as a combinational circuit, on words having a predetermined word length that are obtained by dividing transmission information to be coded.

In this coding assisting equipment, the operation of coding is performed on split words having the prescribed word length collectively in parallel by the combinational circuit. Therefore, coding is performed efficiently without the need for changing the minimum interval at which the words are fed sequentially or providing a means for storing operation objects prior to the start of the operation as long as the response time is shorter than the minimum interval.

The above objects are attained by a decoding assisting equipment in which decoding is performed sequentially, through a computing unit that is formed as a combinational circuit, on words having a predetermined word length that are obtained by dividing transmission information to be decoded.

In this decoding assisting equipment, the operation of decoding is performed on split words having the predetermined word length collectively in parallel by the combinational circuit. Therefore, the decoding is performed efficiently without the need for changing the minimum interval at which the words are fed sequentially or providing a means for storing operation objects prior to the start of the operation as long as the response time is shorter than the minimum interval.

Further, the above objects are attained by a radio transmitter and a radio receiver which incorporate one or both of the above coding assisting equipment and/or the decoding assisting equipment.

With these radio transmitters and radio receivers, transmission information is coded and decoded efficiently and transmitted and received on a radio transmission channel. Therefore, there is less deterioration in transmission efficiency due to the large amount of time needed to encode or decode transmission information and there is higher efficiency in the use of radio transmission channels.

Other objects and features of the invention will become apparent from the following description taken in connection with the accompanying drawings.

BRIEF DESCRIPTION OF THE DRAWINGS

FIG. 4 shows first to third embodiments of the invention;

FIG. 5 is a table showing the principle of a combinational circuit that is provided in a CRC-operation assisting part;

FIG. 6 is a table showing the principle of a combination circuit that is provided in a coding assisting part;

FIG. 10 shows an example configuration of a coding part that is incorporated in a mobile station equipment; and FIG. 11 illustrates problems of a conventional example.

DETAILED DESCRIPTION OF THE PREFERRED EMBODIMENTS

First, the principles of coding assisting equipments and decoding assisting equipments according to the present invention will be described with reference to FIG. 1.

Figure 1:
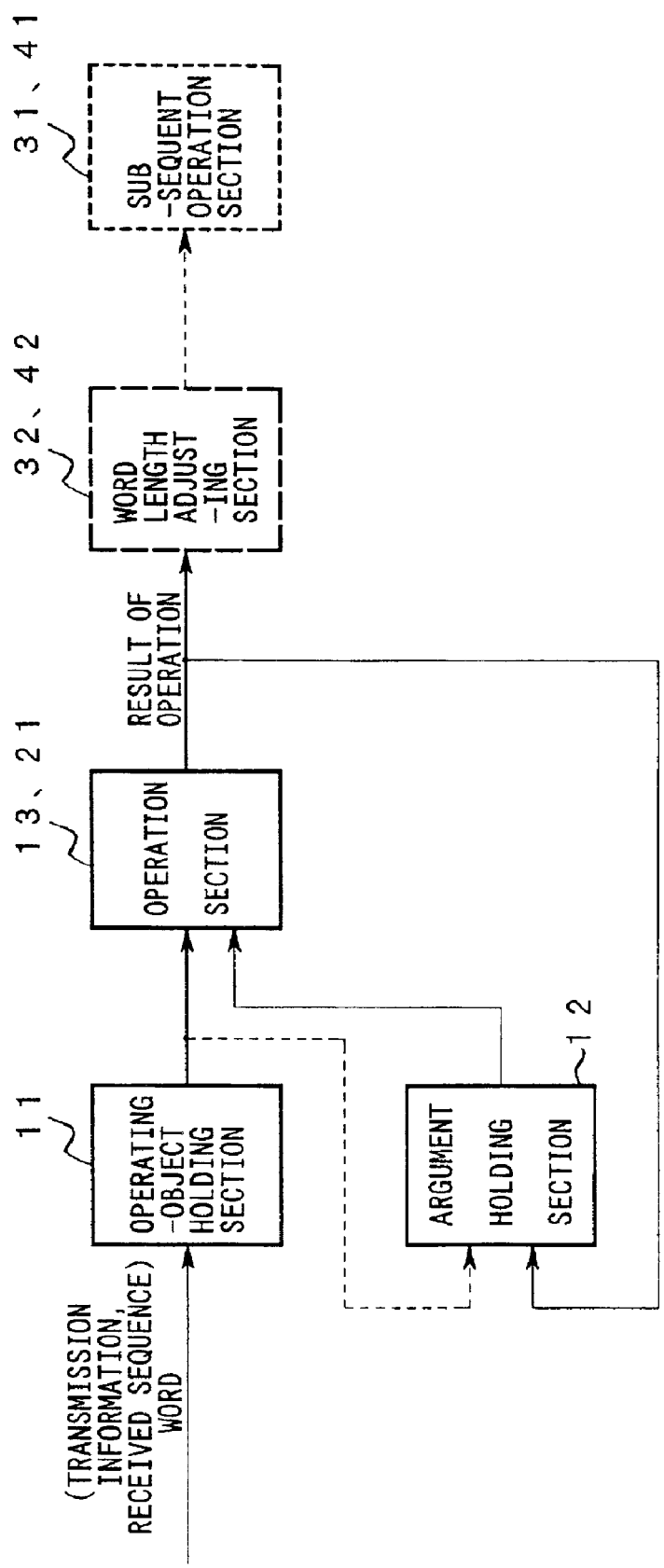
FIG. 1 is a block diagram showing principles of coding assisting equipments and decoding assisting equipments according to the present invention.

FIG. 1 shows the principles of coding assisting equipments and decoding assisting equipments according to the invention. Each of the coding assisting equipments and the decoding assisting equipments shown in FIG. 1 is composed of all or parts of an operating-object holding section 11, an argument holding section 12, an operation section 13 or 21, a word length adjusting section 32 or 42, and a subsequent operation section 31 or 41.

The principle of a first coding assisting equipment according to the invention is as follows.

The operating-object holding section 11 sequentially holds words each consisting of plural bits, and of a constant word length. The argument holding section 12 holds an argument that should be applied to an operation that is performed on a word that is subsequently held by the operating-object holding section 11, and that is included in the word being held by the operating-object holding section 11 and/or the result of an operation performed in advance on the word being held by the operating-object holding section 11. The operation section 13 performs, as the operation, in accordance with logical values of individual bits that are included in the word being held by the operating-object holding section 11 and the argument being held by the argument holding section 12, coding that is defined as a logical operation to be performed on a combination of the logical values.

The operation of the first coding assisting equipment having the above configuration is as follows.

The above-mentioned operation is performed on sequentially fed individual words having the above-mentioned constant word length collectively in parallel by the operation section 13 that is formed as a combinational circuit.

Therefore, the coding is performed efficiently without the need for changing the minimum interval at which the words are fed sequentially or providing a means for storing an operation object prior to a start of the operation as long as the sum total of propagation delay times of the operating-object holding section 11, the operation section 13, and the argument holding section 12 is shorter than the minimum interval or is so short as to be allowable even if it is longer than the minimum interval.

The principle of a second coding assisting equipment according to the invention is as follows.

The operating-object holding section 11 is fed, as the words, pieces of transmission information divided into words of constant word lengths. The operation section 13 divides the transmission information by a generator polynomial in which the degree of the highest term is smaller than or equal to the constant word length.

The operation of the second coding assisting equipment having the above configuration is as follows.

In general, a quotient and a remainder obtained by dividing a transmission information by a generator polynomial in the above-described manner are a linear code or a an algebraic code that is adapted to the generator polynomial.

Therefore, the coding of a transmission information as described above is performed efficiently as parallel operations that are respectively performed on words having the above-mentioned word length.

The principle of a third coding assisting equipment according to the invention is as follows.

The operating-object holding section 11 is fed, as the words, pieces of transmission information divided into units of constant word lengths. The operation section 13 encodes the transmission information according to a tree coding system having a constraint length that is shorter than the constant word length.

The operation of the third coding assisting equipment having the above configuration is as follows.

Since a constraint length shorter than the above-mentioned word length is applied in the above-mentioned tree coding, the coding according to the tree coding system is performed sequentially as a parallel logical operation that is performed on a combination of logical values of bits that are included in individual words that are fed in units of the word length and held by the operating-object holding section 11 and an argument held in advance by the argument holding section 12.

Therefore, the tree coding of transmission information can be performed efficiently as parallel operations that are performed on words having the above mentioned word length.

The principle of a fourth coding assisting equipment according to the invention is as follows.

The operating-object holding section 11 is fed transmission information that is divided into an integer N of words and is added (an) invalid bit string(s) to one or both of the most significant end and/or the least significant end. The operation section 13 excludes the invalid bit string(s) from the operation objects.

The operation of the fourth coding assisting equipment having the above configuration is as follows.

Invalid bits that are packed in transmission information are excluded from the above-mentioned operation object without altering the basic configuration of a combinational circuit that is built-in the operation section 13 and performs a predetermined operation.

Therefore, the coding is performed reliably irrespective of the logical values of such invalid bits.

The principle of a fifth coding assisting equipment according to the invention is as follows.

The operating-object holding section 11 is fed transmission information that is divided into an integer N of words and is added (an) invalid bit string(s) to one or both of the most significant end and/or the least significant end. The operation section 13 employs, as an operation object, valid bit(s) of word(s) that is/are fed as the transmission information and include the invalid bit string.

The operation of the fifth coding assisting equipment having the above configuration is as follows.

A combinational circuit that is built in the operation section 13 is given only the above-mentioned valid bits as an operation object.

Therefore, the coding is performed reliably as long as words of transmission information in which certain invalid bits may be packed and the positions of the invalid bits in those words are known.

The principle of a sixth coding assisting equipment according to the invention is as follows.

The word length adjusting section 32 converts an operation result that is obtained by the operation section 13 into a sequence of words having a constant word length, and sequentially supplies the words to a subsequent operation section 31 for performing a predetermined operation.

The operation of the sixth coding assisting equipment having the above configuration is as follows.

A difference in word length between an operation result obtained by the operation section 13 and an operation object on which a predetermined parallel operation should be performed with the operation result by the subsequent operation section 31 is absorbed independently by the word length adjusting section 32.

Therefore, even where the above-mentioned subsequent operation section 31 is disposed as a subsequent stage of the operation section 13, the coding is performed efficiently through cooperation between the operation section 13 and the subsequent operation section 31 without increasing the load of a section for sequentially feeding words having a constant word length to the operation section 13 via the operating-object holding section 11.

The principle of a first decoding assisting equipment according to the invention is as follows.

The operating-object holding section 11 sequentially holds words each consisting of plural bits, and of a constant word length. The argument holding section 12 holds an argument that should be applied to an operation that is performed on a word that is subsequently held by the operating-object holding section 11, and that is included in the word being held by the operating-object holding section 11 and/or a result of the operation performed in advance on the word being held by the operating-object holding section 11. The operation section 21 performs, as the operation, in accordance with logical values of individual bits that are included in the word being held by the operating-object holding section 11 and the argument being held by the argument holding section 12, decoding that is defined as a logical operation to be performed on a combination of the logical values.

The operation of the first decoding assisting equipment having the above configuration is as follows.

The above-mentioned operation is performed on sequentially fed individual words having the above-mentioned constant word length collectively in parallel by the operation section 21 that is formed as a combinational circuit.

Therefore, the decoding is performed efficiently without the need for changing the minimum interval at which the words are fed sequentially or providing a means for storing an operation object prior to a start of the operation as long as the sum total of propagation delay times of the operating-object holding section 11, the operation section 21, and the argument holding section 12 is shorter than the minimum interval or is so short as to be allowable even if it is longer than the minimum interval.

The principle of a second decoding assisting equipment according to the invention is as follows.

The operating-object holding section 11 is fed, as the words, pieces of received sequence divided into units of the constant word lengths. The operation section 21 divides the received sequence by a generator polynomial in which the degree of the highest term is smaller than or equal to the constant word length.

The operation of the second decoding assisting equipment having the above configuration is as follows.

In general, a quotient and a remainder obtained by dividing a received sequence by a generator polynomial in the above-described manner mean not only transmission information that is represented by the received sequence but also the form or presence/absence of a bit error in the transmission information.

Therefore, the decoding of a received sequence as described above is performed efficiently as parallel operations that are respectively performed on words having the above-mentioned word length.

The principle of a third decoding assisting equipment according to the invention is as follows.

The word length adjusting section 42 converts an operation result that is obtained by the operation section 21 into a sequence of words having a constant word length, and sequentially supplies the words to a subsequent operation section 41 for performing a predetermined operation.

The operation of the third decoding assisting equipment having the above configuration is as follows.

A difference in word length between an operation result obtained by the operation section 21 and an operation object on which a predetermined parallel operation should be performed with the operation result by the subsequent operation section 41 is absorbed independently by the word length adjusting section 42.

Therefore, even where the above-mentioned subsequent operation section 41 is disposed as the subsequent stage of the operation section 21, the decoding is performed efficiently through cooperation between the operation section 21 and the subsequent operation section 41 without increasing the load of a means for sequentially feeding words having a constant word length to the operation section 21 via the operating-object holding section 11.

Figure 2:
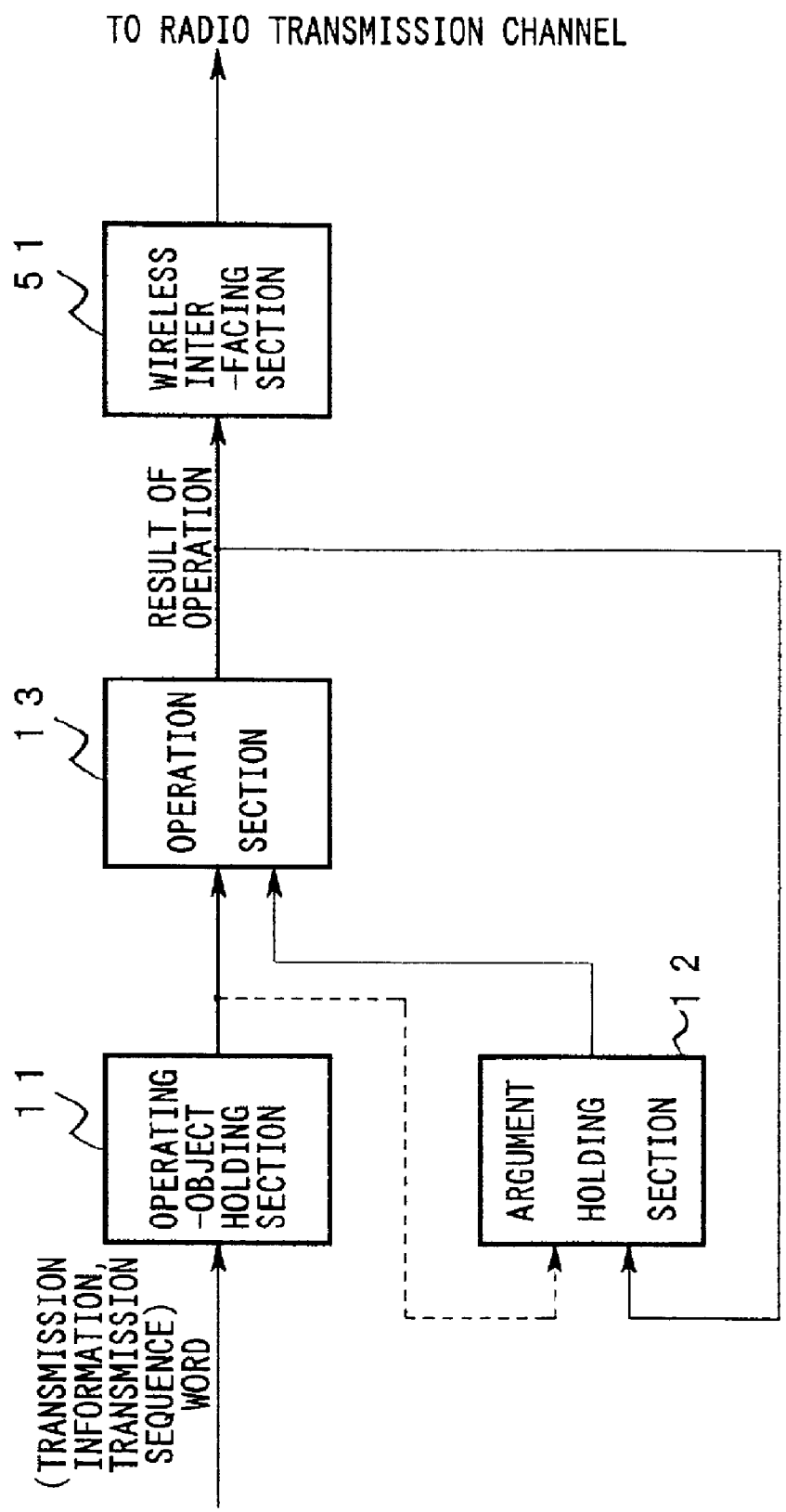
FIG. 2 is a block diagram showing the principle of a radio transmitter according to the invention.

FIG. 2 is a block diagram showing the principle of a radio transmitter according to the invention.

The radio transmitter shown in FIG. 2 is composed of an operating-object holding section 11, an argument holding section 12, an operation section 13, and a wireless interfacing section 51.

The principle of the radio transmitter according to the invention is as follows.

The operating-object holding section 11 sequentially holds words each consisting of plural bits, and of a constant word length. The argument holding section 12 holds an argument that should be applied to an operation that is performed on a word that is subsequently held by the operating-object holding section 11, and that is included in the word being held by the operating-object holding section 11 and/or a result of the operation performed in advance on the word being held by the operating-object holding section 11. The operation section 13 performs, as the operation, in accordance with logical values of individual bits that are included in the word being held by the operating-object holding section 11 and the argument being held by the argument holding section 12, coding that is defined as a logical operation to be performed on a combination of the logical values. The wireless interfacing section 51 transmits a result of the operation performed by the operation section 13 to a radio transmission channel.

In the above-configured radio transmitter, transmission information that is fed as a sequence of words as described above is encoded efficiently by the operation section 13 and transmitted to a radio transmission channel via the wireless interfacing section 51.

Therefore, a delay of transmission of such transmission information due to the fact that long time is needed to encode the transmission information is reduced and the transmission efficiency and the efficiency of use of a radio transmission channel is increased.

Figure 3:
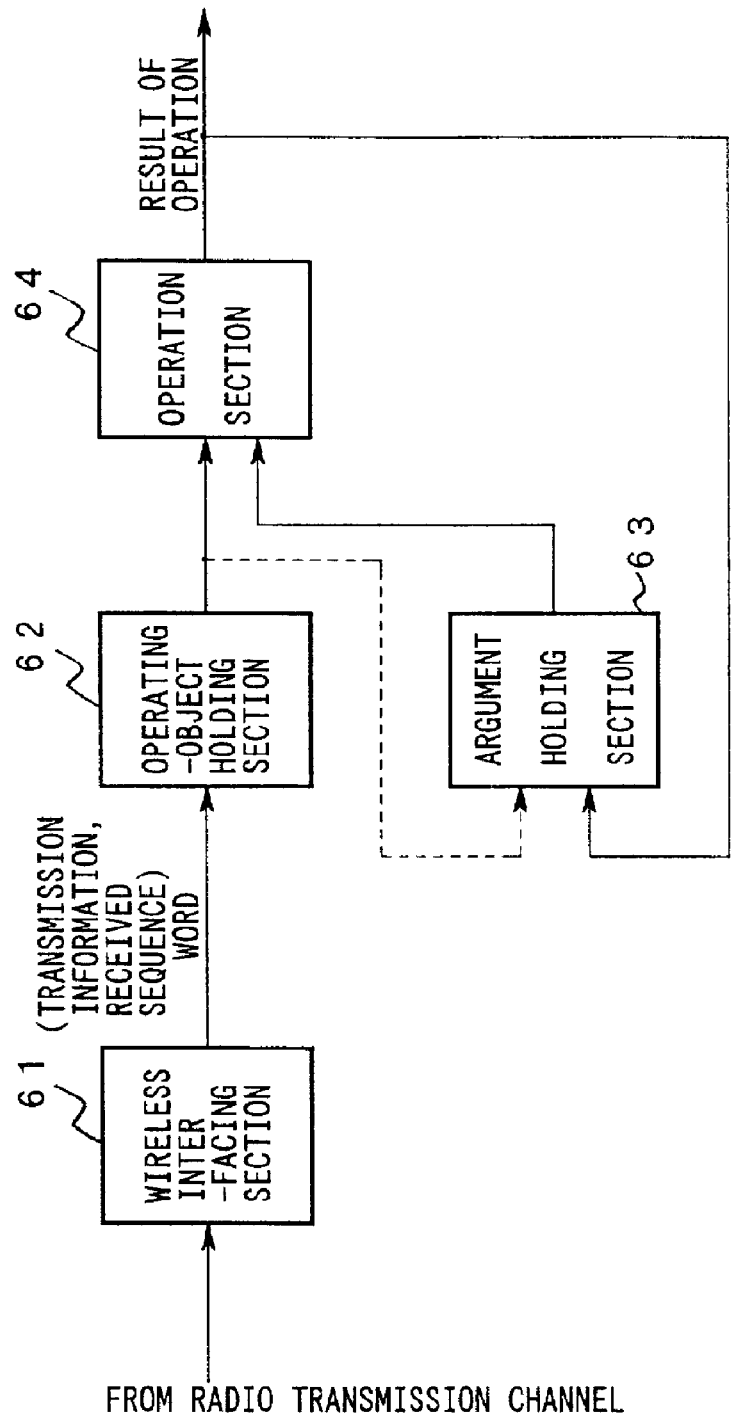
FIG. 3 is a block diagram showing the principle of a radio receiver according to the invention.

FIG. 3 is a block diagram showing the principle of a radio receiver according to the invention.

The radio receiver shown in FIG. 3 is composed of a wireless interfacing section 61, an operating-object holding section 62, an argument holding section 63, and an operation section 64.

The principle of the radio receiver according to the invention is as follows.

The wireless interfacing section 61 demodulates a radio-frequency signal that has been transmitted on a radio transmission channel, and divides transmission information that is given as the radio-frequency signal into words each consisting of plural bits and of a constant word length and outputs the words. The operating-object holding section 62 sequentially holds the words that are output from the wireless interfacing section 61. The argument holding section 63 holds an argument that should be applied to an operation that is performed on a word that is subsequently held by the operating-object holding section 62, and that is included in the word being held by the operating-object holding section 62 and/or the result of the operation performed in advance on the word being held by the operating-object holding section 62. The operation section 64 performs, as the operation, in accordance with logical values of individual bits that are included in the word being held by the operating-object holding section 62 and the argument being held by the argument holding section 63, decoding that is defined as a logical operation to be performed on a combination of the logical values.

In the above-configured radio receiver, transmission information that is received via a radio transmission channel is decoded efficiently under cooperation among the wireless interfacing section 61, the operating-object holding section 62, the argument holding section 63, and the operation section 64.

Therefore, a transmission delay due to the fact that long time is needed to decode such transmission information is reduced and the transmission efficiency and the efficiency of use of a radio transmission channel is increased.

Embodiments of the present invention will be hereinafter described in detail with reference to the accompanying drawings.

FIG. 4 shows first to third embodiments of the invention.

These embodiments are different from the conventional example of FIG. 10 in that the transmitter buffer 121, the shift register 122, the counter 123, and the controlling part 124 are not provided, that a CRC-operation assisting part 70 is provided in place of the CRC operation part 125, that a coding assisting part 71 is provided in place of the convolutional coding part 126, that an interleaver 72 is provided in place of the interleaver 127, and that the output of the CRC-operation assisting part 70 and the input of the coding assisting part 71 are connected to corresponding input/output ports of a processor (not shown).

The CRC-operation assisting part 70 is composed of a buffer 74 the input of which is connected to a first output port of the processor; a read-clock generating part 75 the input of which is connected to a second output port of the processor and a first output of which is connected to a control input of the buffer 74; flip-flops (FFs) 76-1 to 76-8 the inputs of which are directly connected to eight parallel outputs of the buffer 74; an inverter 77 the input of which is directly connected to a second output of the read-clock generating part 75; flip-flops (FFs) 78-0 to 78-2 reset terminals of which are directly connected to the output of the inverter 77, enable terminals of which are directly connected to a third output of the read-clock generating part 75, and that are disposed as the final stage; an exclusive-OR gate 79-1 having the output that is directly connected to a load terminal of the flip-flop 78-0 as well as seven inputs that are directly connected to the outputs of the respective flip-flops 76-1, 76-4, 76-6 to 76-8, 78-1, and 78-2; an exclusive-OR gate 79-2 having the output that is directly connected to a load terminal of the flip-flop 78-1 as well as five inputs that are directly connected to the outputs of the respective flip-flops 76-3, 76-5 to 76-7, and 78-0; and an exclusive-OR gate 79-3 having the output that is directly connected to a load terminal of the flip-flop 78-2 as well as five inputs that are directly connected to the outputs of the respective flip-flops 761, 76-2, 76-7, 76-8, and 78-2.

The coding assisting part 71 is composed of a buffer 80 the input of which is connected to a third output port of the processor; a clock generating section 81 the input of which is connected to a fourth output port of the processor and one output of which is directly connected to a control input of the buffer 80; flip-flops (FFs) 82-1 to 82-8 the inputs of which are connected to respective eight parallel outputs of the buffer 80; a delay circuit (D) 83 the input of which is directly connected to the other output of the clock generating section 81; flip-flops (FFs) 84-0 and 84-1 reset terminals of which are directly connected to the output of the delay circuit 83 and the inputs of which are connected to the outputs of the respective flip-flops 82-7 and 82-8; an exclusive-OR gate 85-1 having two inputs that are directly connected to the outputs of the respective flip-flops 82-1 and 84-0; an exclusive-OR gate 85-2 having two inputs that are directly connected to the outputs of the respective flip-flops 82-1 and 84-1; an exclusive-OR gate 85-3 having two inputs that are directly connected to the outputs of the respective flip-flops 82-1 and 82-2; an exclusive-OR gate 85-4 having two inputs that are directly connected to the outputs of the respective flip-flops 82-2 and 84-0; an exclusive-OR gate 85-5 having two inputs that are directly connected to the outputs of the respective flip-flops 82-2 and 82-3; an exclusive-OR gate 85-6 having two inputs that are directly connected to the outputs of the respective flip-flops 82-1 and 82-3; an exclusive-OR gate 85-7 having two inputs that are directly connected to the outputs of the respective flip-flops 82-3 and 82-4; an exclusive-OR gate 85-8 having two inputs that are directly connected to the 6 outputs of the respective flip-flops 82-2 and 82-4; an exclusive-OR gate 85-9 having two inputs that are directly connected to the outputs of the respective flip-flops 82-4 and 82-5; an exclusive-OR gate 85-10 having two inputs that are directly connected to the outputs of the respective flip-flops 82-3 and 82-5; an exclusive-OR gate 85-11 having two inputs that are directly connected to the outputs of the respective flip-flops 82-5 and 82-6; an exclusive-OR gate 85-12 having two inputs that are directly connected to the outputs of the respective flip-flops 82-4 and 82-6; an exclusive-OR gate 85-13 having two inputs that are directly connected to the outputs of the respective flip-flops 82-6 and 82-7; an exclusive-OR gate 85-14 having two inputs that are directly connected to the outputs of the respective flip-flops 82-5 and 82-7; an exclusive-OR gate 85-15 having two inputs that are directly connected to the outputs of the respective flip-flops 82-7 and 82-8; an exclusive-OR gate 85-16 having two inputs that are directly connected to the outputs of the respective flip-flops 82-6 and 82-8; and flip-flops (FFs) 86-1 to 8616 that are disposed, as the final stage, subsequent stage of the respective exclusive-OR gates 85-1 to 85-16.

The operation of the first embodiment of the invention will be described below.

In the CRC-operation assisting part 70, when receiving a reset signal from the processor, the read-clock generating part 75 resets the flip-flops 78-0 to 78-2 via the inverter 77. To simplify the description, it is assumed that all of the flip-flops 78-0 to 78-2 are reset by this resetting.

The read-clock generating part 75 detects a write enable signal that is fed from the processor every time partial transmission information is output from the processor, and supplies the write enable signal to the buffer 74.

The buffer 74 captures the partial transmission information that is output from the processor at a point in time of reception of the write enable signal, and stores the partial transmission information.

The partial transmission information thus stored in the buffer 74 is copied to the flip-flops 76-1 to 76-8 automatically and quickly.

Incidentally, the number of bits that can be stored parallel in the flip-flops 78-0 to 78-2 is equal to a word length "3" of an FCS that is calculated by the CRC operation part 125 shown in FIG. 10 and determined based on the above-described generator polynomial G(x).

Where the logical values of initial values that are set in the flip-flops 78-0 to 78-2 are i0, i1, and i2, respectively, and the logical values of the eight bits of partial transmission information that are serially supplied to the CRC operation part 125 after determination of the above initial values are d1, d2, d3, d4, d5, d6, d7, and d8 in time-series order that is represented by t (=1 to 8), (a) a logical value obtained at the output of the exclusive-OR gate 129, (b) logical values held by the respective flip-flops 130-1 and 130-2, (c) a logical value obtained at the output of the exclusive-OR gate 131, and (d) a logical value held by the flip-flop 130-3 are given in time-series order by logical formulae shown in FIG. 5. In FIG. 5, a symbol, which is a mark "+" with a circle around it, means an operator of exclusive-OR.

In FIG. 5, in general, among the operation objects of the exclusive-OR operations that produce the above logical values (a)–(d), omission can be made for operation objects that are redundant in an even number.

Specifically, in the dividing circuit that is composed of the flip-flops 130-1 to 130-3 and the exclusive-OR gates 129 and 131 shown in FIG. 10, the logical values held by the respective flip-flops 130-1 to 130-3 are uniquely determined as I0, I1, and I2 as halftone-dot-meshed in FIG. 5 at a point in time when the eight bits of partial transmission information having respective logical values d1, d2, d3, d4, d5, d6, d7, and d8 have been fed sequentially in a serial manner.

On the other hand, in the CRC-operation assisting part 70, the above logical values i0–i2 are given as logical values held by the respective flip-flops 78-0 to 78-2 and the logical values d1, d2, d3, d4, d5, d6, d7, and d8 are given as logical values held by the respective flip-flops 76-1 to 76-8.

Further, the exclusive-OR gates 79-1 to 79-3 perform according to the logical values i0–i2 and d1–d8, exclusive-OR operations that collectively obtain I0, I1, and I2 that are given by logical formulae shown in FIG. 5.

The logical values i0–i2 are set at "0" immediately after resetting. However, when a certain operation has been performed in advance by the exclusive-OR gates 79-1 to 79-3, the logical value I0, I1, and I2 are delivered as the operation results.

Every time a write enable signal (described above) is fed from the processor, the read-clock generating part 75 feeds an enable signal to the flip-flops 78-0 to 78-2 at a point in time that is delayed from the point in time of the feeding of the write enable signal by more than a propagation delay time of the buffer 74, the flip-flops 76-1 to 76-8, and the exclusive-OR gates 19-1 to 79-3.

When receiving the enable signal, the flip-flops 780 to 78-2 hold the logical values I0, I1, and I2 that are output from the respective exclusive-OR gates 79-1 to 79-3 at this point in time.

The logical values I0, I1, and I2 are referred to, as results that were determined for partial transmission information that was fed from the processor in advance, during the course of similar operations on partial transmission information that will be fed subsequently.

After feeding all pieces of partial transmission information (a predetermined number of bytes) to the CRC-operation assisting part 70, the processor reads an FSC that is held by the flip-flops 78-0 to 78-2, and generates a bit string (hereinafter referred simply as "CRC code") in which the FSC is added to the sequence of those pieces of partial transmission information.

Further, the processor feeds a reset signal to the coding assisting part 71, and sequentially feeds, to the coding assisting part 71, a write enable signal and a "partial CRC code" obtained by dividing the above CRC code into bytes.

In the coding assisting part 71, the buffer 80, the clock generating section 81, the delay circuit 83, and the flip-flops 82-1 to 82-8, 84-0, and 84-1 operate in cooperation with the processor like the buffer 74, the read-clock generating part 75, the inverter 77, and the flip-flops 76-1 to 76-8 and 78-0 to 78-2 of the CRC-operation assisting part 70 do. Their detailed operations will be described below.

Incidentally, the number of bits that can be stored parallel in the flip-flops 84-0 and 84-1 is set in advance at "3," which is equal to the word length of a bit string that is held by the flip-flops 131-1 to 131-3 during the course of the operation performed by the convolutional coding part 126 shown in FIG. 10.

Where the logical values of initial values that are set in the flip-flops 84-0 and 84-1 are c0 and c1, respectively, and the logical values of the 8 bits of a partial CRC code that are fed serially after determination of those initial values are f1, f2, f3, f4, f5, f6, f7, and f8 in time-series order that is represented by t (=1 to 8), (A) logical values held by the respective flip-flops 131-1 to 131-3, and (B) logical values obtained at the outputs of the respective exclusive-OR gates 132-1 and 132-2 are given in time-series order as shown in FIG. 6. In FIG. 6, a symbol, which is a mark "+" with a circle around it, means an operator of exclusive-OR.

That is, in the convolutional coding part 126 shown in FIG. 10, during the course that the eight bits of a partial CRC code word having logical values f1, f2, f3, f4, f5, f6, f7, and f8 are given sequentially in a serial manner, the logical values of a convolutional code that is obtained under the cooperation among the exclusive-OR gates 132-1 and 132-2 and the selector 133 in accordance with a combination of logical values held by the respective flip-flops 131-1 to 131-3 are uniquely determined as g1, g2, g3, g4, g5, g6, g7, g8, g9, g10, g11, g12, g13, g14, g15, and g16 that are halftone-dot-meshed in FIG. 6.

In the coding assisting part 71, the exclusive-OR gates 85-1 to 85-16 perform, on the logical values c0 and c1 held by the flip-f lops 84-0 and 84-1 and the logical values f1, f2, f3, f4, f5, f6, f7, and f8, exclusive-OR operations that collectively determine logical values g1–g16 that are given by the respective formulae shown in FIG. 6.

Both of the above-mentioned logical values c0 and c1 are set at "0" immediately after resetting. However, when certain operations have been performed in advance by the exclusive-OR gates 85-1 to 85-16, the logical values C0 and C1 are delivered as results C0 and C1 of the operations.

The logical values g1, g2, g3, g4, g5, g6, g7, g8, g9, g10, g11, g12, g13, g14, g15, and g16 are held by the respective flip-flops 86-1 to 86-16.

Among the logical values f1, f2, f3, f4, f5, f6, f7, and f8 held by the respective flip-flops 82-1 to 82-8, the logical values f7 and f8 are, as included in the logical formulae shown in FIG. 6 that give the logical values g1, g2, and g4, held by the respective flip-flops 84-0 and 84-1 as operation objects of operations that will be performed in a similar manner on a partial CRC code word that will be fed subsequently.

The interleaver 72 generates a transmission sequence by sequentially capturing partial convolutional codes each of which is given as a sequence of 16-bit logical values g1, g2, g3, g4, g5, g6, g7, g8, g9, g10, g11, g12, g13, g14, g15, and g16 in accordance with each partial CRC code that is fed from the processor and performing processing that is equivalent to the interleave processing performed by the interleaver 127 shown in FIG. 10.

That is, the CRC operation and the convolutional coding are performed sequentially and quickly by the combinational circuits that perform parallel operations in accordance with partial transmission information and partial CRC code words that are fed from the processor on a byte-by-byte basis.

Partial transmission information and partial CRC code words are used as operation objects of the CRC operation and the convolutional coding unlike the conventional case in which they are collectively stored in the transmitter buffer and then read sequentially.

Among the pieces of software that are built in the process that feeds partial transmission information and partial CRC code words, the configuration of software that realizes the CRC-operation assisting part 70 need not be modified to a large extent as long as the sum total of propagation delay times of the buffer 74, the flip-flops 76-1 to 76-8, the exclusive-OR gates 79-1 to 79-3, and the flip-flops 78-0 to 78-2 is shorter than the bus cycle of the processor or is so short as to be allowable.

The configuration of software that realizes the coding assisting part 71 need not be modified to a large extent as long as the sum total of propagation delay times of the buffer 80, the flip-flops 82-1 to 82-8, the exclusive-OR gates 85-1 to 85-16, and the flip-flops 86-1 to 86-16 is shorter than the bus cycle of the processor or is so short as to be allowable.

Therefore, according to this embodiment, the hardware scale can be reduced and a transmission sequence can be generated efficiently without the need for modifying the hardware and software configurations to a large extent.

In this embodiment, the CRC-operation assisting part 70 realizes an efficient CRC operation by operating under the above-described processor. However, the invention is not limited to such a CRC operation and can similarly be applied to coding that uses any of various linear codes that include not only cyclic codes but also algebraic codes such as the BCH code that conforms to the Galois field theory.

In this embodiment, the coding assisting part 71 realizes efficient convolutional coding by operating under the processor. However, the invention is not limited to such convolutional coding and can be applied to any tree coding irrespective of the constraint length and the rate of the code as long as a result of coding of each of bit strings that are given in the form of divided words having a predetermined word length is uniquely determined for the logical values of the bit string and a result can be determined by a combinational circuit.

A second embodiment of the invention will be hereinafter described.

Figure 7:
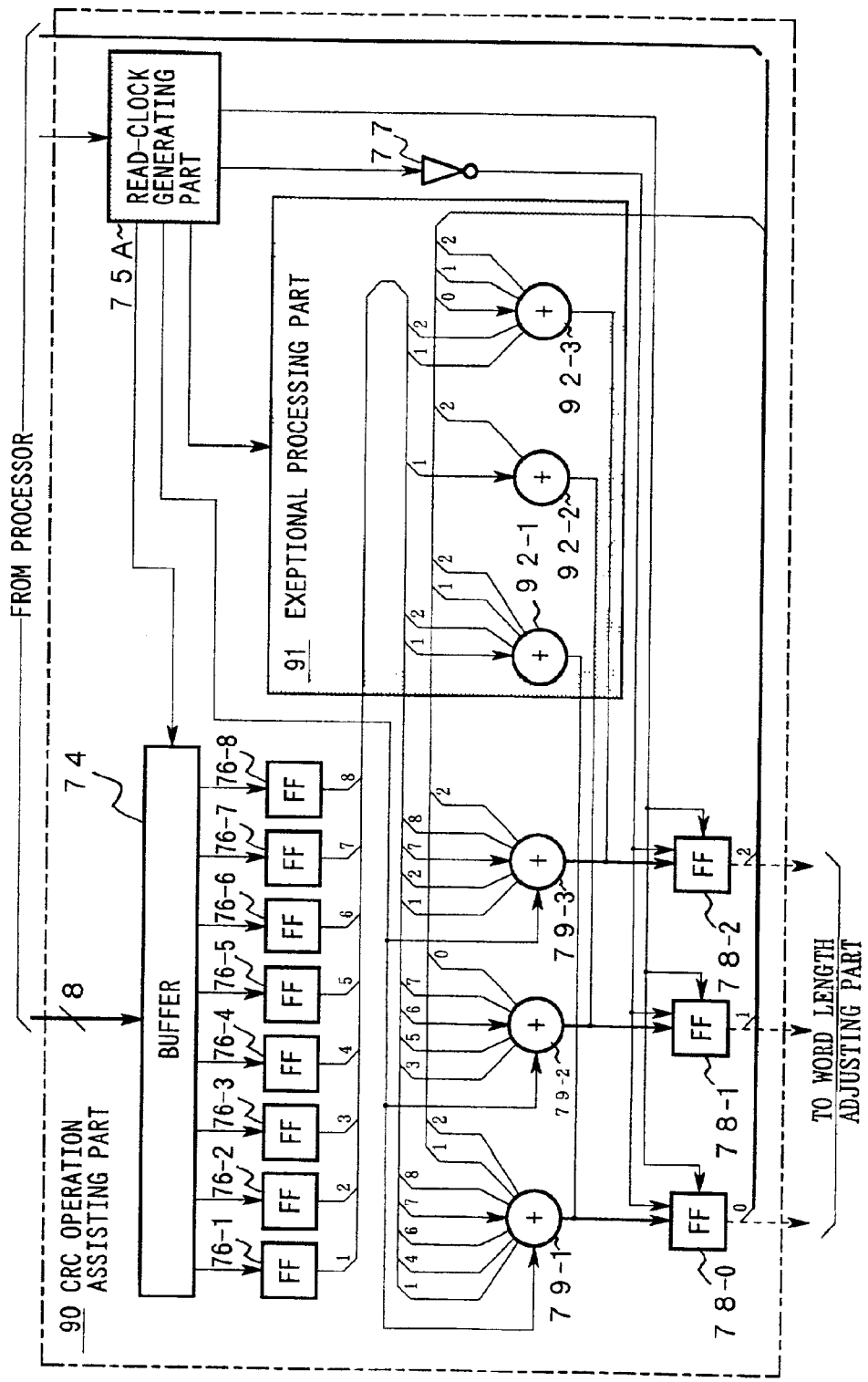
FIG. 7 shows another configuration of the CRC-operation assisting part.

The second embodiment is different, in configuration, from the first embodiment in that a CRC-operation assisting part 90 shown in FIG. 7 is provided in place of the CRC-operation assisting part 70.

The CRC-operation assisting part 90 is different, in configuration, from the CRC-operation assisting part 70 in that a read-clock generating part 75A having a control output that is directly connected to the control terminals of the respective exclusive-OR gates 79-1 to 79-3 is provided in place of the read-clock generating part 75, and that an exceptional processing part 91 is provided having an input terminal that is directly connected to the outputs of the respective flip-flops 76-1, 76-2, 78-0, 78-1, and 78-2, output terminals that are directly connected to the load terminals of the respective flip-flops 78-0 to 78-2, together with the outputs of the respective exclusive-OR gates 79-1 to 79-3 and a control terminal to which a particular output of the read-clock generating part 75A is directly connected.

As indicated by hatched halftone dot meshing in FIG. 5, the exceptional processing part 91 is composed of an exclusive-OR gate 92-1 having the input that is directly connected to the outputs of the respective flip-flops 76-1, 76-2, 78-1, and 78-2 and the output that is directly connected to the load terminal of the flip-flop 78-0, an exclusive-OR gate 92-2 having the input that is directly connected to the outputs of the respective flip-flops 76-1 and 78-2 and the output that is directly connected to the load terminal of the flip-flop 78-1, and an exclusive-OR gate 92-3 having the input that is directly connected to the outputs of the respective flip-flops 76-1, 76-2, 78-0, 78-1 and 78-2 and the output that is directly connected to the load terminal of the flip-flop 78-2.

The operation of the second embodiment of the invention will be described below with reference to FIGS. 4 and 7.

Figure 8:
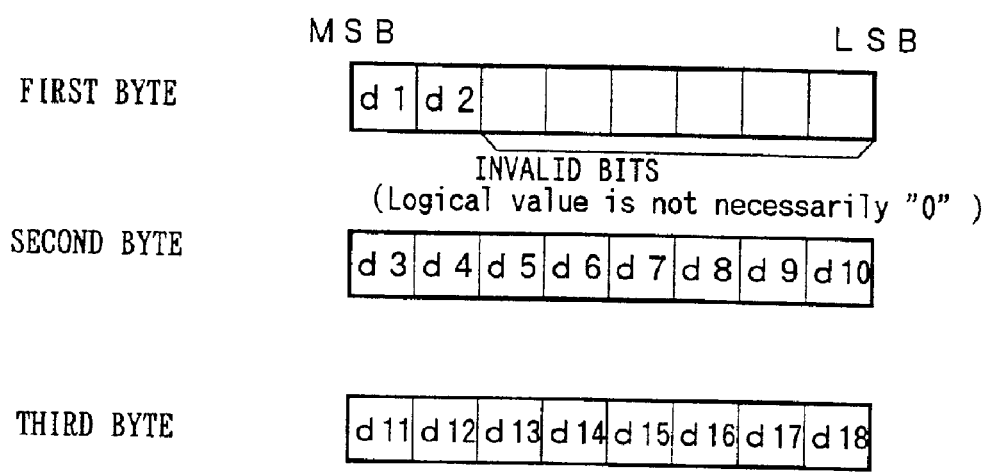
FIG. 8 shows a format of partial transmission information that is fed to the CRC-operation assisting part.

In this embodiment, as shown in FIG. 8, the processor sequentially feeds, to the buffer 74, pieces of partial transmission information consisting of a first byte in which valid bits are packed in only the higher two bits and second and third bytes in each of which valid eight bits are packed.

The read-clock generating part 75A counts write enable signals that are fed from the processor starting from a point in time when a reset signal is fed from the processor.

Further, during a period when the count value is "1," the read-clock generating part 75A allows operation of the exceptional processing part 91 and prohibits the exclusive-OR gates 79-1 to 79-3 from performing logical operations. During a period when the count value is "2" or "3," the read-clock generating part 75A prohibits operation of the exceptional processing part 91 and allows the exclusive-OR gates 79-1 to 79-3 to perform logical operations.

That is, during a period when the above-mentioned first byte as partial transmission information is fed from the processor, only the valid higher two bits of the partial transmission information are used as an operation object. Therefore, the CRC operation is performed correctly even if information of any logical values is packed in the lower six bits of the first byte.

In this embodiment, the exceptional processing part 91 is added on condition that invalid bits of the first byte are excluded from an operation object. Errors that might otherwise occur in a result of the CRC operation due to such invalid bits are avoided by the exceptional processing part 91's operating in place of the exclusive-OR gates 79-1 to 79-3.

However, where invalid bits are packed in only a higher degree of the first byte and the logical values of all the invalid bits are "0," the CRC-operation assisting part 70 shown in FIG. 4 may be provided in place of the CRC-operation assisting part 90 shown in FIG. 7.

Where invalid bits are packed in one or both of a high degree of the first byte and a lower degree of the third byte and any of the logical values of those invalid bits is "1," there may be provided an operation circuit that performs a logical operation that is adapted to pieces of partial transmission information that are fed as only the first and third bytes or an operation circuit that invalidates, when necessary, bits that should be input to an operation circuit that performs a logical operation adapted to partial transmission information that is fed as the second byte in place of the exclusive-OR gates 79-1 to 79-3.

A third embodiment of the invention will be hereinafter described.

The third embodiment is different, in configuration, from the first embodiment in that, as indicated by a broken line in FIG. 4, the outputs of the CRC-operation assisting part 70 and the inputs of the coding assisting part 71 are connected to none of the input/output ports of the processor, a word length adjusting part 73 is provided between the CRC-operation assisting part 70 and the coding assisting part 71, and transmission information inputs of the word length adjusting part 73 are connected in parallel to the inputs of the buffer 74.

The operation of the third embodiment will be described below with reference to FIG. 4.

Since the operations that the CRC-operation assisting part 70 performs in cooperation with the processor are the same as in the first embodiment, they are not described here.

The word length adjusting part 73 captures, instead of the processor, partial transmission information that was fed from the processor to the CRC-operation assisting part 70 and an FCS that is obtained by the CRC-operation assisting part 70, and stores those.

Further, the word length adjusting part 73 converts a CRC code that consists of the partial transmission information sequence and the FCS into a sequence of partial CRC code words (described above) and sequentially supplies the latter to the coding assisting part 71.

That is, according to this embodiment, the operation of the convolutional coding that should be performed after the CRC operation is performed reliably because the processing that is performed by the processor in the first and second embodiments is performed here by the word length adjusting part 73.

This reduces the load of the processor and prevents a transmission sequence from being generated with an undue delay due to an overload of the processor.

In each of the above embodiments, the invention is applied to the coding for generating a transmission sequence. However, the application range of the invention is not limited to such a coding process and the invention can similarly be applied to decoding of a received sequence as long as the above-mentioned word length conforms to the degree, the constraint length, and the rate of the code of a desired generator polynomial and one or both of division based on the generator polynomial and tree decoding are performed during the course of the decoding.

Figure 9:
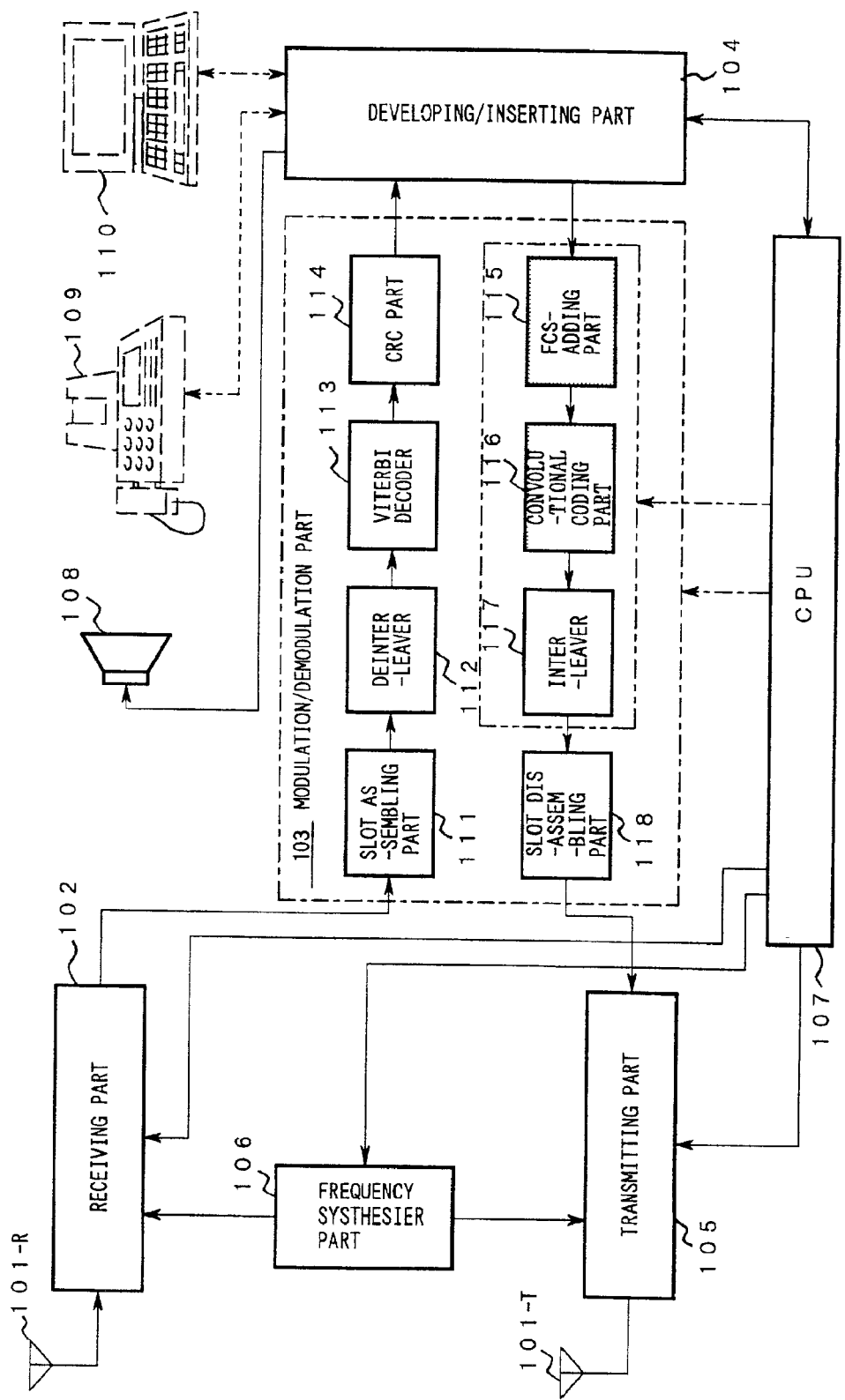
FIG. 9 shows a fourth embodiment of the invention.

FIG. 9 shows a fourth embodiment of the invention.

As shown in FIG. 9, the input of a receiving part 102 is connected to the feeding point of an antenna 101-R and the output of the receiving part 102 is connected to a demodulation input of a modulation/demodulation part 103. A demodulation output of the modulation/demodulation part 103 is connected to a demodulation input of a developing/inserting section 104. A modulation output of the developing/inserting section 104 is connected to a modulation input of the modulation/demodulation part 103. A modulation output of the modulation/demodulation part 103 is connected to the feeding point of an antenna 101-T via a transmitting part 105. Corresponding outputs of a synthesizer section 106 are connected to local oscillation inputs of the transmitting part 105 and the receiving part 102. Corresponding input/output ports of a processor (CPU) 107 are connected to control input/output terminals of the receiving part 102, the modulation/demodulation part 103, the developing/inserting section 104, the transmitting part 105, and the synthesizing section 106. A speaker 108 and a microphone (not shown) are connected to analog ports of the developing/inserting section 104, and a facsimile terminal 109, a personal computer 110, and other terminals are connected to digital ports of the developing/inserting section 104.

The modulation/demodulation part 103 is composed of a slot assembling part 111, de-interleaver 112, a Viterbi decoder 113, and a CRC part 114 that are cascade between the above-mentioned demodulation input and demodulation output and operate under the processor 107, and an FCS-adding part 115, a convolutional coding part 116, an interleaver 117, and a slot disassembling part 118 that are cascade between the above-mentioned modulation input and modulation output and operate under the processor 107.

The operation of the fourth embodiment will be described below.

The basic operations of the individual sections are as follows.

The processor 107 takes a leading part in a channel control by cooperating with the developing/inserting section 104 and the modulation/demodulation part 103 as well as the receiving part 102, the transmitting part 105, and the synthesizer section 106.

During the course of such a channel control, the processor 107 instructs the synthesizer section 106 to generate a local oscillation signal having a frequency that conforms to a predetermined channel mapping and zone configuration.

A received wave that has been transmitted from a radio base station that forms a wireless zone where the local station exists and has reached the antenna 101-R is converted by the receiving part 102 that operates in accordance with the above-mentioned local oscillation signal into a predetermined intermediate frequency signal, which is converted into a baseband signal (hereinafter referred to as "downward baseband signal") through demodulation.

In the modulation/demodulation part 103, the slot assembling part 111 extracts a sequence of slots that are designated by the processor 107 under the above-mentioned channel control from slots that are included in the downward baseband signal in a predetermined form and assembles those, and thereby generates a bit string representing transmission information (hereinafter referred to as "downward transmission information") that has been received on a particular radio channel (e.g., a perch channel on which the local station is waiting).

The de-interleaver 112, the Viterbi decoder 113, and the CRC part 114 restores the downward transmission information by performing de-interleave processing, convolutional decoding, and CRC processing on the bit string.

The de-interleave processing, the convolutional decoding, and the CRC processing are kinds of processing that are reversible with respect to a CRC operation, convolutional coding, and interleave processing that the radio base station performed on transmission information to generate a transmission sequence to be transmitted on the above-mentioned particular channel.

The developing/inserting section 104 performs delivering of the downward transmission information between the processor 107 or the facsimile terminal 109 (or the personal computer 110) and the CRC part 114 in units of a predetermined word length (for simplification, here it is assumed to be a byte).

Further, by performing processing that is reverse to the processing that realizes the above-mentioned delivering under the processor 107, the developing/inserting section 104 supplies, to the modulation/demodulation part 103, in units of a predetermined word length, transmission information (hereinafter referred to as "upstream transmission information") that is fed from the processor 107 or the facsimile terminal 109 (or the personal computer 110) and is to be transmitted to the radio base station.

In the modulation/demodulation part 103, the FCS-adding part 115, the convolutional coding part 116, the interleaver 117, and the slot disassembling part 118 perform, on the thus-fed transmission information, processing that is reverse to the processing that was performed in the above-described manner by the CRC part 114, the Viterbi decoder 113, the de-interleaver 112, and the slot assembling part 111, and thereby generates a baseband signal (hereinafter referred to as "upstream baseband signal") that includes the upstream transmission information and consists of a bit string that should be located in predetermined slots.

The synthesizer section 106 generates a local oscillation signal to be used for transmission in accordance with a command that is supplied from the processor 107 according to a channel control procedure.

The transmitting part 105 generates a transmission wave by performing, in accordance with the upstream baseband signal and the local oscillation signal, processing that is reverse to the processing that was performed in the above-described manner by the receiving part 102, and transmits the generated transmission wave to the radio base station via the antenna 101-T.

Incidentally, in this embodiment, the FCS-adding part 115, the convolutional coding part 116, and the interleaver 117 that are provided in the modulation/demodulation part 103 cooperate with the processor 107 and the developing/ inserting section 104 that operates under the processor 107 as indicated by a two-dot chain line in FIG. 9, and are configured as the CRC-operation assisting part 70, the coding assisting part 71, and the interleaver 72 shown in FIG. 4, respectively.

That is, each of the CRC operation and the convolutional coding is performed at high speed by a combinational circuit that performs parallel operations on a byte-by-byte basis without making the hardware scale larger than in the conventional example or greatly modifying the hardware configuration from the conventional example.

Therefore, this embodiment makes it possible to flexibly adapt to a multiple access system, a channel mapping, and a zone configuration that are employed and to perform efficient channel control without changing the basic configuration of software that is built in the processor 107 or greatly increasing the power consumption.

In this embodiment, the invention is applied to the FCS-adding part 115, the convolutional coding part 116, and the interleaver 117 that serve for transmission among the components of the modulation/demodulation part 103.

However, the application range of the invention is not limited to the FCS-adding part 115, the convolutional coding part 116, and the interleaver 117. For example, where the de-interleaver 112 outputs a received sequence by dividing it into bytes, the invention may be applied to one or both of the Viterbi decoder 113 and the CRC part 114. Where the Viterbi decoder 113 outputs, with dividing into bytes, a bit string that is obtained by decoding such a received sequence, the invention may be applied to the CRC part 114.

In this embodiment, the invention is applied to the terminal equipment of a mobile communication system to which the CDMA scheme is applied. However, the application range of the invention is not limited to such a multiple access system and the invention can similarly be applied to radio transmission systems to which the TDMA system or the FDMA system is applied.

In this embodiment, no specific description is made of a modulation system that is applied to a radio transmission channel as well as of the above-described channel mapping and zone configuration, the channel mapping, the zone configuration, and the modulation system may be of any kind.

In each of the above embodiments, the above-mentioned word length is set at a single byte. However, the word length may be set at any value as long as division based on a predetermined generator polynomial or tree coding is performed so as to conform to the degree, the rate of the code, and the constraint length of a desired generator polynomial as in the case of, for example, coding or decoding of a block code in a process of one or both of generation of a transmission sequence and demodulation of a received sequence.

Further, the invention is not limited to the above embodiments and a variety of embodiments are possible without departing from the spirit and scope of the invention. Any improvements may be made in part or all of the constituent sections.

What is claimed is:

1. A coding assisting equipments comprising:
   operating-object means for sequentially holding each word respectively consisting of plural bits of transmission information, and divided into constant word lengths;
   argument holding means for holding an argument that should be applied to an operation that is performed on a word that is subsequently held by said operating-object holding means, and the argument being included in said word being held by said operating-object holding means and/or the result of an operation performed in advance on the word being held by said operating-object holding means; and
   operation means for performing, as said operation, in accordance with logical values of individual bits that are included in said word being held by said operating-object holding means and said argument being held by said argument holding means, coding that is defined as a logical operation to be performed on a combination of said logical values, and for outputting a word whose word length is constant.

2. A decoding assisting equipment comprising:
   operating-object holding means for sequentially holding each word respectively consisting of plural bits of received series, and divided into constant word lengths;
   arguments holding means for holding an argument that should be applied to an operation that is performed on a word that is subsequently held by said operating-object holding means, and the argument being included in said word being held by said operating-object holding means and/or results of an operation performed in advance on the word being held by said operating-object holding means; and
   operation means for performing, as said operation, in accordance with logical values of individual bits that are included in said word being held by said operating-object holding means and said argument being held by said argument holding means, coding that is defined as a logical operation to be performed on a combination of said logical values, and for outputting a word whose length is constant.

3. A coding assisting equipment according to claim 1, wherein said operating-object holding means is fed with, as said words, pieces of transmission information divided into units of said constant word lengths, and wherein said operation means divides said transmission information by a generator polynomial in which a degree of the highest term is smaller than or equal to said word length.

4. A decoding assisting equipment according to claim 2, wherein said operating-object holding means is fed with, as said words, pieces of received sequence divided into units of said constant word lengths, and wherein said operation means divides said received sequence by a generator polynomial in which a degree of the highest term is smaller than or equal to said word length.

5. A coding assisting equipment according to claim 1, wherein said operating-object holding means is fed with, as said words, pieces transmission information divided into units of said constant word lengths, and wherein the operation means tree encodes said transmission information with a constraint length that is shorter than said constant word length.

6. A coding assisting equipment according to claim 3, wherein said operating-object holding means is fed with transmission that is divided into an integer N of words and is added (a) padding bit string(s) to one or both of the most significant end and/or the least significant end, and wherein said operation means excludes said padding bit string(s) from the operation objects.

7. A coding assisting equipment according to claim 3, wherein said operating-object holding means is fed with transmission that is divided into an integer N of words and is added (a) padding bit string(s) to one or both of the most significant end and/or the least significant end, and wherein the operation means employs, as an operation object, valid bit(s) of word(s) that is/are fed as said transmission information and include said padding bit string.

8. A coding equipment according to claim 1, further comprising word length adjusting means for converting an operation result that is obtained by said operation means into a sequence of words having a constant word length, and for sequentially supplying the words to a subsequent operation means for performing a predetermined operation.

9. A coding assisting equipment according to claim 3, further comprising word length adjustment means for converting an operation result that is obtained by said operation means into a sequence of words having a constant word length, and for sequentially supplying the words to a subsequent operation means for performing a predetermined operation.

10. A coding assisting equipment according to claim 5, further comprising word length adjusting means for converting an operation result that is obtained by said operation means into a sequence of words having a constant word length, and for sequentially supplying the words to a subsequent operation means for performing a predetermined operation.

11. A coding assisting equipment according to claim 6, further comprising word length adjusting means for converting an operation result that is obtained by said operation means into a sequence of words having a constant word length, and for sequentially supplying the words to a subsequent operation means for performing a predetermined operation.

12. A coding assisting equipment according to claim 7, further comprising word length adjusting means for converting an operation result that is obtained by said operation means into a sequence of words having a constant word length, and for sequentially supplying the words to a subsequent operation means for performing a predetermined operation.

13. A decoding assisting equipment according to claim 2, further comprising word length adjusting means for converting an operation result that is obtained by said operation means into a sequence of words having a constant word length, and for sequentially supplying the words to a subsequent operation means for performing a predetermined operation.

14. A decoding assisting equipment according to claim 4, further comprising word length adjusting means for converting an operation result that is obtained by said operation means into a sequence of words having a constant word length, and for a sequentially supplying the words to a subsequent operation means for performing a predetermined operation.

15. A radio transmitter comprising:

operating-object holding means for sequentially holding each word respectively consisting of plural bits of transmission information, and divided into constant word lengths;

argument holding means for holding an argument that should be applied to an operation that is performed on a word that is subsequently held by said operating-object holding means, and the argument being included in said word being held by said operating-object holding means and/or results of an operation performed in advance on the word being held by said operating-object holding means;

operation means for performing, as a said operation, in accordance with logical values of individual bits that are included in said word being held by said operating-object holding means and said argument being held by said argument holding means, coding that is defined as a logical operation to be performed on a combination of said logical values, and for outputting a word whose word length is constant; and wireless interfacing means for transmitting the result of said operation performed by said operation means to a radio transmission channel.

16. A radio receiver comprising:

wireless interfacing means for determining a radio-frequency signal reached through a radio transmission channel, and for dividing transmission information that is given as said radio-frequency signal into words each consisting of plural bits and of a constant word length and for outputting the words;

operating-object holding means for sequentially holding said words that are output from said wireless interfacing means;

argument holding means for holding an argument that should be applied to an operation that is performed on a word that is subsequently held by said operating-object holding means, and the argument being included in said word being held by said operating-object holding means and/or the result of an operation performed in advance on the word being held by said operating-object holding means; and operation means for performing, as said operation, in accordance with logical values of individual bits that are included in said word being held by said operating-object holding means and said argument being held by said argument holding means, coding that is defined as a logical operation to be performed on a combination of said logical values, and for outputting a word whose word length is constant.

* * * * *